US012525438B2

(12) United States Patent
Aoki

(10) Patent No.: US 12,525,438 B2
(45) **Date of Patent: *Jan. 13, 2026**

(54) PLASMA PROCESSING APPARATUS AND STORAGE MEDIUM

(71) Applicant: Tokyo Electron Limited, Tokyo (JP)

(72) Inventor: Yusuke Aoki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 419 days.

This patent is subject to a terminal disclaimer.

(21) Appl. No.: 18/111,118

(22) Filed: Feb. 17, 2023

(65) Prior Publication Data

US 2023/0268165 A1 Aug. 24, 2023

(30) Foreign Application Priority Data

Feb. 21, 2022 (JP) ................................ 2022-024971

(51) Int. Cl.
*H01J 37/32* (2006.01)
*G01R 31/52* (2020.01)

(52) U.S. Cl.
CPC ........ *H01J 37/32577* (2013.01); *G01R 31/52* (2020.01); *H01J 37/32715* (2013.01); *H01J 2237/2007* (2013.01); *H01J 2237/24564* (2013.01); *H01J 2237/334* (2013.01)

(58) Field of Classification Search
CPC ........... H01J 37/32577; H01J 37/32715; H01J 2237/2007; H01J 2237/24564; H01J 2237/334; G01R 31/52
USPC .................................................... 156/345.28
See application file for complete search history.

(56) References Cited

U.S. PATENT DOCUMENTS 11,923,229 B2 * 3/2024 Aoki ................. H01J 37/32449
2007/0035908 A1 * 2/2007 Kitsunai ............. H01L 21/6833 361/234
2021/0183625 A1 * 6/2021 Arakane ........... H01J 37/32449
2022/0199363 A1 * 6/2022 Aoki ................. H01J 37/32009

FOREIGN PATENT DOCUMENTS

JP H11-087480 A 3/1999

* cited by examiner

*Primary Examiner* — Charlee J. C. Bennett
(74) *Attorney, Agent, or Firm* — XSENSUS LLP

(57) ABSTRACT

A plasma processing apparatus includes an electrostatic chuck that adsorbs a substrate, a relay circuit that turns ON and OFF the supply of voltage to the electrostatic electrode, a plasma generator, and a controller. The controller (a) controls the DC power supply to supply the voltage to the electrostatic electrode, thereby adsorbing the substrate to the electrostatic chuck, (b) controls the relay circuit to turn OFF the supply of the voltage to the electrostatic electrode, thereby bringing the electrostatic electrode into a floating state, (c) controls the plasma generator to start a plasma processing of the substrate, (d) controls the relay circuit to turn ON the supply of the voltage to the electrostatic electrode, thereby acquiring current flowing through the power supply line, and (e) determines an adsorbed state of the substrate based on the current.

8 Claims, 9 Drawing Sheets

PLASMA PROCESSING APPARATUS AND STORAGE MEDIUM

CROSS-REFERENCE TO RELATED APPLICATIONS

This application is based on and claims priority from Japanese Patent Application No. 2022-024971, filed on Feb. 21, 2022 with the Japan Patent Office, the disclosure of which is incorporated herein in its entirety by reference.

TECHNICAL FIELD

The present disclosure relates to a plasma processing apparatus and a storage medium.

BACKGROUND

Japanese Patent Laid-Open Publication No. H11-087480 proposes detecting defective adsorption of a substrate after adsorbing and holding the substrate by an electrostatic chuck, by introducing a gas into a gap between an electrostatic chuck plate and the substrate, and monitoring the pressure in the gap.

SUMMARY

According to an aspect of the present disclosure, a plasma processing apparatus includes an electrostatic chuck accommodated in a plasma processing chamber, including an electrostatic electrode, and configured to adsorb a substrate by a voltage supplied to the electrostatic electrode; a DC power supply configured to supply the voltage to the electrostatic electrode; a relay circuit provided in a power supply line between the DC power supply and the electrostatic electrode and configured to turn ON and OFF the supply of the voltage to the electrostatic electrode; a plasma generator configured to generate a plasma inside the plasma processing chamber; and a controller configured to control an overall operation of the plasma processing apparatus. The controller is configured to (a) control the DC power supply to supply the voltage to the electrostatic electrode, thereby adsorbing the substrate to an upper surface of the electrostatic chuck; (b) after the voltage supplied to the electrostatic electrode is stabilized, control the relay circuit to turn OFF the supply of the voltage to the electrostatic electrode, thereby bringing the electrostatic electrode into a floating state; (c) after the voltage supplied to the electrostatic electrode is stabilized, control the plasma generator to start a plasma processing of the substrate adsorbed to the electrostatic chuck; (d) after the plasma processing of the substrate is started, control the relay circuit to turn ON the supply of the voltage to the electrostatic electrode by the relay circuit, thereby acquiring current flowing through the power supply line when the voltage is supplied to the electrostatic electrode; and (e) determine an adsorbed state of the substrate based on the current.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
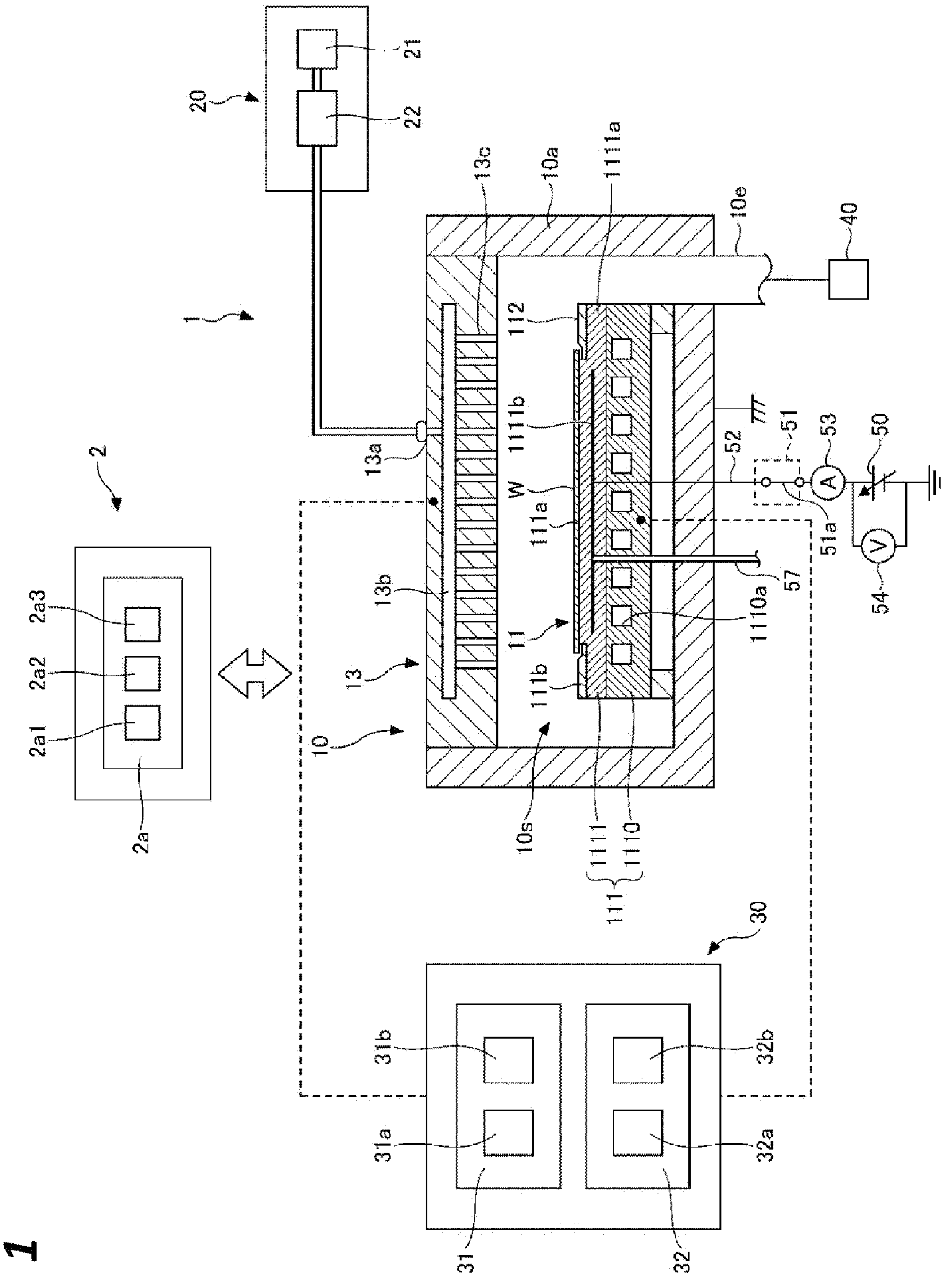
FIG. 1 is a diagram illustrating an example of a plasma processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to the drawings. In each drawing, the same reference numerals may be given to the same components, and redundant descriptions may be omitted.

In the present specification, orientations such as parallel, right angle, orthogonal, horizontal, vertical, up-and-down, and left-and-right are allowed to deviate to the extent that effects of each embodiment are not impaired. The shape of a corner is not limited to a right angle but may be rounded in arc shape. Parallel, right angle, orthogonal, horizontal, vertical, circular, and coincident may include substantially parallel, substantially right angle, substantially orthogonal, substantially horizontal, substantially vertical, substantially circular, and substantially coincident.

[Plasma Processing Apparatus]

A configuration example of a plasma processing apparatus will be described below. FIG. 1 is a diagram illustrating a configuration example of a capacitively coupled plasma processing apparatus.

The plasma processing apparatus 1 is a capacitively coupled plasma processing apparatus, and includes a controller 2. The plasma processing apparatus 1 includes a plasma processing chamber 10, a gas supplying unit 20, a power supply 30, and an exhaust system 40. Further, the plasma processing apparatus 1 includes a substrate supporting unit 11 and a gas introducing unit. The gas introducer is configured to introduce at least one processing gas into the plasma processing chamber 10. The gas introducing unit includes a shower head 13. The substrate supporting unit 11 is arranged inside the plasma processing chamber 10. The shower head 13 is arranged above the substrate supporting unit 11. In an embodiment, the shower head 13 constitutes at least a part of the ceiling of the plasma processing chamber 10. The plasma processing chamber 10 has a plasma processing space 10*s* defined by the shower head 13, a sidewall 10*a* of the plasma processing chamber 10, and the substrate supporting unit 11. The plasma processing chamber 10 has at least one gas supply port for supplying at least one processing gas into the plasma processing space 10*s*, and at least one gas discharge port for discharging the gas from the plasma processing space. The plasma processing chamber 10 is grounded. The shower head 13 and the substrate supporting unit 11 are electrically insulated from a housing of the plasma processing chamber 10.

The substrate supporting unit 11 includes a main body 111 and a ring assembly 112. The main body 111 has a central region 111*a* for supporting a substrate W and an annular region 111*b* for supporting the ring assembly 112. A wafer is an example of the substrate W. The annular region 111*b* of the main body 111 surrounds the central region 111*a* of the main body 111 in plan view. The substrate W is disposed on the central region 111*a* of the main body 111, and the ring assembly 112 is disposed on the annular region 111*b* of the main body 111 so as to surround the substrate W on the central region 111*a* of the main body 111. Thus, the central region 111*a* is also called a substrate support surface for supporting the substrate W, and the annular region 111*b* is also called a ring support surface for supporting the ring assembly 112.

In an embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111*a* and an electrostatic electrode 1111*b* arranged inside the ceramic member 1111*a*. The ceramic member 1111*a* has the central region 111*a*. In an embodiment, the ceramic member 1111*a* also has the annular region 111*b*. Another member surrounding the electrostatic chuck 1111, such as an annular electrostatic chuck or an annular insulating member, may have the annular region 111*b*. In this case, the ring assembly 112 may be disposed on the annular electrostatic chuck or the annular insulating member, or may be disposed on both the electrostatic chuck 1111 and the annular insulating member. Further, at least one RF/DC electrode, which is coupled to a radio-frequency (RF) power supply 31 and/or a direct current (DC) power supply 32 to be described later, may be arranged inside the ceramic member 1111*a*. In this case, the at least one RF/DC electrode functions as a lower electrode. When a bias RF signal and/or DC signal to be described later is supplied to the at least one RF/DC electrode, the RF/DC electrode is also called a bias electrode. The conductive member of the base 1110 and at least one RF/DC electrode may function as a plurality of lower electrodes. Further, the electrostatic electrode 1111*b* may function as a lower electrode. Thus, the substrate supporting unit 11 includes at least one lower electrode.

The ring assembly 112 includes one or a plurality of annular members. In an embodiment, one or a plurality of annular members include one or a plurality of edge rings and at least one covering. The edge ring is formed of a conductive material or insulating material, and the covering is formed of an insulating material.

Further, the substrate supporting unit 11 may include a temperature adjustment module that adjusts at least one of the electrostatic chuck 111, the ring assembly 112, and the substrate to a target temperature. The temperature adjustment module may include a heater, a heat transfer medium, a flow path 1110*a*, or a combination thereof. A heat transfer fluid such as brine or gas flows through the flow path 1110*a*. In an embodiment, the flow path 1110*a* is formed in the base 1110, and one or a plurality of heaters are arranged inside the ceramic member 1111*a* of the electrostatic chuck 1111. Further, the substrate supporting unit 11 may include a heat transfer gas supplying unit that supplies a heat transfer gas to a gap between the back surface of the substrate W and the central region 111*a*. For example, the heat transfer gas supplying unit supplies He gas, which is an example of the heat transfer gas, to the gap between the back surface of the substrate W and the central region 111*a* from a heat transfer gas supply line 57 passing through the main body 111.

The shower head 13 is configured to introduce at least one processing gas from the gas supplying unit 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. Further, the shower head 13 includes at least one upper electrode. The gas introducing unit may include one or a plurality of side gas injectors (SGI) provided in one or a plurality of openings formed in the sidewall 10*a*, in addition to the shower head 13.

The gas supplying unit 20 may include at least one gas source 21 and at least one flow rate controller 22. In an embodiment, the gas supplying unit 20 is configured to supply at least one processing gas from each corresponding gas source 21 to the shower head 13 through each corresponding flow rate controller 22. Each flow rate controller 22 may include, for example, a mass flow controller or a pressure-controlled flow rate controller. The gas supplying unit 20 may further include one or more flow rate modulation devices that modulate or pulse the flow rate of at least one processing gas.

The power supply 30 includes an RF power supply 31 coupled to the plasma processing chamber 10 via at least one impedance matching circuit. The RF power supply 31 is configured to supply at least one RF signal (RF power) to at least one lower electrode and/or at least one upper electrode. Thus, a plasma is formed from at least one processing gas supplied to the plasma processing space 10*s*. Thus, the RF power supply 31 may function as at least a part of a plasma generator that generates a plasma from one or more processing gases in the plasma processing chamber 10. Further, when a bias RF signal is supplied to at least one lower electrode, a bias potential occurs in the substrate W, so that ion components of the formed plasma may be drawn into the substrate W.

In an embodiment, the RF power supply 31 includes a first RF generator 31*a* and a second RF generator 31*b*. The first RF generator 31*a* is coupled to at least one lower electrode and/or at least one upper electrode via at least one impedance matching circuit, and is configured to generate a source RF signal (source RF power) for plasma generation. In an embodiment, the source RF signal has a frequency in a range of 10 MHz to 150 MHz. In an embodiment, the first RF generator 31*a* may be configured to generate a plurality of source RF signals with different frequencies. The generated one or plurality of source RF signals are supplied to at least one lower electrode and/or at least one upper electrode.

The second RF generator 31*b* is coupled to at least one lower electrode via at least one impedance matching circuit, and is configured to generate a bias RF signal (bias RF power). The frequency of the bias RF signal may be the same as or different from the frequency of the source RF signal. In an embodiment, the bias RF signal has a lower frequency than the frequency of the source RF signal. In an embodiment, the bias RF signal has a frequency in a range of 100 kHz to 60 MHz. In an embodiment, the second RF generator 31*b* may be configured to generate a plurality of bias RF signals with different frequencies. The generated one or plurality of bias RF signals are supplied to at least one lower electrode. Further, in various embodiments, at least one of the source RF signal and the bias RF signal may be pulsed.

Further, the power supply 30 may include a DC power supply 32 coupled to the plasma processing chamber 10. The DC power supply 32 includes a first DC generator 32*a* and a second DC generator 32*b*. In an embodiment, the first DC generator 32*a* is connected to at least one lower electrode, and is configured to generate a first DC signal. The generated first DC signal is applied to at least one lower electrode. In an embodiment, the second DC generator 32*b* is connected to at least one upper electrode, and is configured to generate a second DC signal. The generated second DC signal is applied to at least one upper electrode.

In various embodiments, at least one of the first and second DC signals may be pulsed. In this case, a sequence of voltage pulses is applied to at least one lower electrode and/or at least one upper electrode. The voltage pulse may have a pulse waveform of a rectangle, a trapezoid, a triangle, or a combination thereof. In an embodiment, a waveform generator for generating a sequence of voltage pulses from a DC signal is connected between the first DC generator 32*a* and at least one lower electrode. Thus, the first DC generator 32*a* and the waveform generator constitute a voltage pulse generator. When the second DC generator 32*b* and the waveform generator constitute the voltage pulse generator, the voltage pulse generator is connected to at least one upper electrode. The voltage pulse may have a positive polarity, or may have a negative polarity. Further, the sequence of voltage pulses may include one or a plurality of positive-polarity voltage pulses and one or a plurality of negative-polarity voltage pulses within one cycle. The first and second DC generators 32*a* and 32*b* may be provided in addition to the RF power supply 31, and the first DC generator 32*a* may be provided in place of the second RF generator 31*b*.

The exhaust system 40 may be connected to, for example, a gas outlet 10*e* provided in a bottom portion of the plasma processing chamber 10. The exhaust system 40 may include a pressure regulating valve and a vacuum pump. The pressure inside the plasma processing space 10*s* is regulated by the pressure regulating valve. The vacuum pump may include a turbo molecular pump, a dry pump, or a combination thereof.

The controller 2 processes computer-executable instructions that cause the plasma processing apparatus 1 to execute various processes described in the present disclosure. The controller 2 may be configured to control each element of the plasma processing apparatus 1 so as to execute various processes described herein. In an embodiment, a part or the entirety of the controller 2 may be included in the plasma processing apparatus 1. The controller 2 may include a processor 2*a*1, a storage 2*a*2, and a communication interface 2*a*3. The controller 2 is implemented by, for example, a computer 2*a*. The processor 2*a*1 may be configured to perform various control operations by reading a program from the storage 2*a*2 and executing the read program. This program may be stored in advance in the storage 2*a*2, or may be acquired via a medium when necessary. The acquired program is stored in the storage 2*a*2, and is read out from the storage 2*a*2 and executed by the processor 2*a*1. The medium may be various storage media readable by the computer 2*a*, or may be a communication line connected to the communication interface 2*a*3. The processor 2*a*1 may be a central processing unit (CPU). The storage 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 via a communication line such as a local area network (LAN).

[Substrate Adsorption Processing]

A substrate adsorption processing is performed before subjecting the substrate W to a plasma processing. The substrate W is loaded into the plasma processing chamber 10, and is disposed on the upper surface of the electrostatic chuck 1111. Further, a gas is supplied into the plasma processing space 10*s* from the gas supplying unit 20 through the shower head 13, and an RF signal is supplied to a conductive member of the substrate supporting unit 11, a conductive member of the shower head 13, or both from the RF power supply 31. During the substrate adsorption processing, a plasma is generated inside the plasma processing space 10*s* by an inert gas such as argon gas supplied into the plasma processing space 10*s*.

Figure 2:
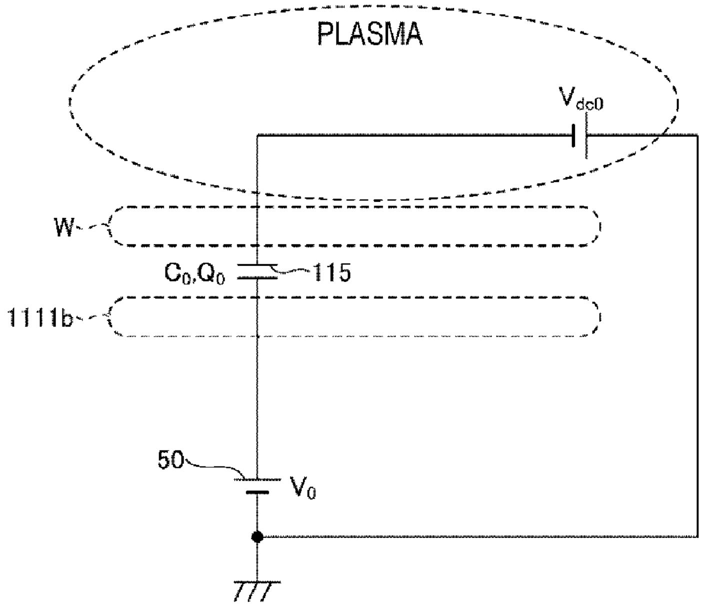
FIG. 2 is a diagram illustrating an example of an equivalent circuit when adsorbing a substrate.

In this state, the adsorption processing is executed, so that the substrate W is adsorbed to the substrate support surface 111*a*. FIG. 2 illustrates an example of an equivalent circuit when adsorbing the substrate. As illustrated in FIG. 2, in the adsorption processing, a voltage is applied from a DC power supply 50 to the electrostatic electrode 1111*b*, and a closed circuit is created through a plasma. A capacitive component 115 with a capacitance $C_0$ exists between the substrate W and the electrostatic electrode 1111*b* by the dielectric electrostatic chuck 1111. A charge $Q_0$ is the charge accumulated in the capacitive component 115 at this time, and is represented by $Q_0=C_0V_0$.

A self-bias $V_{dc0}$ is generated in the substrate W according to an RF signal, mainly a bias RF signal. The self-bias $V_{dc0}$ is a voltage having a greater negative potential when the voltage of the bias RF signal is negative than when the voltage of the bias RF signal is positive. When the generated self-bias $V_{dc0}$ is too large, ions are strongly drawn, which may cause a damage to the substrate W due to the adsorption processing. Therefore, a weak plasma with a small self-bias $V_{dc0}$ is generated in the adsorption processing.

Assuming that the voltage, which is supplied to the electrostatic electrode 1111*b* from the DC power supply 50 during adsorption, is $V_0$, the electrostatic force $F_0$ generated between the substrate W and the electrostatic electrode 1111*b* by the capacitive component 115 is such that the self bias $V_{dc0}$ is negligibly smaller than the voltage $V_0$. For this reason, it is represented by, for example, the following equation (1).

$$F_0=k(C_0V_0/r)^2 \quad (1)$$

In equation (1), k is an integer, and r is the distance between the back surface of the substrate W and the electrostatic electrode 1111*b*. The voltage $V_0$ supplied to the electrostatic electrode 1111*b* is a DC voltage during adsorption which is set in advance such that the electrostatic force $F_0$ has a predetermined magnitude.

Figure 3:
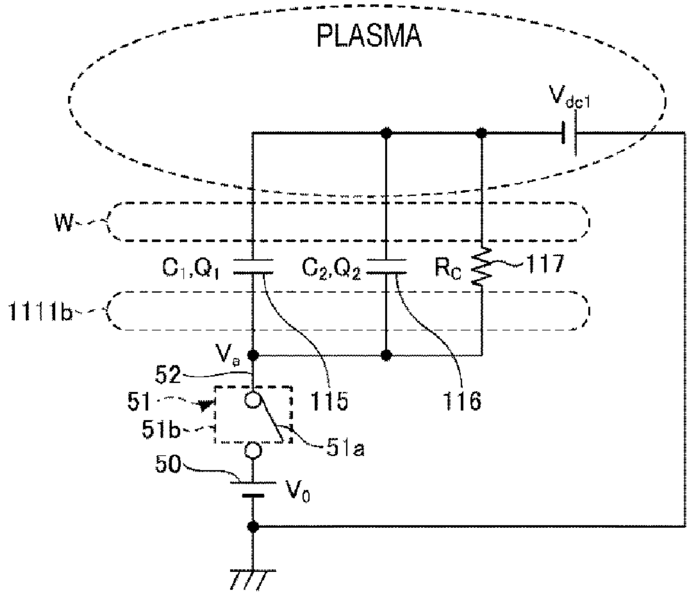
FIG. 3 is a diagram illustrating an example of an equivalent circuit during a plasma processing according to an embodiment.

When a processing gas is supplied after the substrate W is adsorbed, and the substrate W is subjected to a plasma processing by a plasma of the processing gas stronger than that during adsorption, as illustrated in FIG. 3, the self-bias $V_{dc1}$ greater than the self-bias $V_{dc0}$ during the adsorption processing is generated. Further, when the plasma processing of the substrate W starts, the adsorption state between the substrate W and the substrate support surface 111*a* changes under the influence of the plasma, and the capacitance of the capacitive component 115 between the substrate W and the electrostatic electrode 1111*b* changes from $C_0$ to $C_1$. Further, when the plasma processing of the substrate W starts, the temperature of the substrate W or the state of the surface of the electrostatic chuck 1111 changes under the influence of the plasma, and the state of the contact surface between the substrate W and the substrate support surface 111*a* changes. Thus, a capacitive component 116 with a capacitance $C_2$ or a resistive component 117 with a resistance value $R_C$ is generated between the substrate W and the electrostatic electrode 1111*b*.

A charge $Q_1$ accumulated in the capacitive component 115 and a charge $Q_2$ accumulated in the capacitive component 116 are represented by, for example, the following equation (2). The capacitance $C_1$ of the capacitive component 115 during the plasma processing is substantially the same as the capacitance $C_0$ of the capacitive component 115 during the adsorption processing.

$$Q_1+Q_2=C_1(V_0+V_{dc1})+C_2(V_0+V_{dc1}) \quad (2)$$

Here, since the charge $Q_0$ accumulated in the capacitive component 115 during the adsorption processing is $C_0V_0$, referring to the above equation (2), the charges $Q_1$ and $Q_2$, which are greater than the charge $Q_0$ accumulated during the adsorption processing, are accumulated in the substrate W during the plasma processing under the influence of the self bias $V_{dc1}$. This makes it easier for particles generated inside the plasma processing space 10*s* during the plasma processing to be adsorbed to the substrate W.

Further, the electrostatic force F generated between the substrate W and the electrostatic electrode 1111*b* by the capacitive component 115 and the capacitive component 116 is represented by, for example, the following equation (3).

$$F=F_1+F_2=k(C_1(V_0+V_{dc1})/r)^2+k(C_2(V_0+V_{dc1})/r)^2 \quad (3)$$

Here, since the capacitance $C_2$ of the capacitive component 116 is negligibly smaller than the capacitance $C_1$ of the capacitive component 115, the electrostatic force F generated between the substrate W and the electrostatic electrode 1111*b* may be approximated by, for example, the following equation (4).

$$F\approx k(C_1(V_0+V_{dc1})/r)^2 \quad (4)$$

When comparing the above equation (4) with the above-described equation (1), the electrostatic force F during the plasma processing of the substrate W after adsorption is greater than the electrostatic force $F_0$ during the adsorption processing due to the influence of the self bias $V_{dc1}$. Therefore, it is considered that the adsorption force between the substrate W and the electrostatic electrode 1111*b* (electrostatic chuck 1111) becomes excessive during the plasma processing of the substrate W. Since the self-bias $V_{dc1}$ fluctuates depending on the state of the plasma processing, it is difficult to accurately set in advance the voltage $V_0$ having a magnitude added with the self-bias $V_{dc1}$.

When the adsorption force between the substrate W and the electrostatic chuck 1111 becomes excessive, the frictional force between the substrate W and the substrate support surface 111*a* increases. Thus, the amount of particles generated by friction between the substrate W and the substrate support surface 111*a* increases according to the difference in thermal expansion coefficient between the substrate W and the substrate support surface 111*a*. Also, as the operating temperature of the electrostatic chuck 1111 rises, the adsorption force increases and the amount of particles to be generated also increases. Further, when the adsorption force between the substrate W and the substrate support surface 111*a* becomes excessive, the substrate W may bounce or break when separating the plasma-processed substrate W from the substrate support surface 111*a* by a lift pin or the like.

Therefore, in the adsorption processing according to the present embodiment, a relay circuit 51 arranged in a power supply line 52 between the electrostatic electrode 1111*b* and the DC power supply 50 turns ON and OFF the supply of the voltage to the electrostatic electrode 1111*b*. When a switch 51*a* of the relay circuit 51 is turned ON (the connected state), the DC power supply 50 is connected to the electrostatic electrode 1111*b*, and the DC voltage $V_0$ with a preset magnitude is supplied from the DC power supply 50 to the electrostatic electrode 1111*b* through the relay circuit 51 and the power supply line 52. Thus, the substrate W is adsorbed to the electrostatic chuck 1111.

In the adsorption processing, after the voltage supplied to the electrostatic electrode 1111*b* of the electrostatic chuck 1111 is stabilized, the switch 51*a* of the relay circuit 51 is turned OFF (the open state), and the plasma processing is executed. FIG. 3 illustrates an example of an equivalent circuit during a plasma processing according to an embodiment. When the switch 51*a* is turned OFF, the electrostatic electrode 1111*b* is brought into the floating state.

Assuming that the voltage of the electrostatic electrode 1111*b* during the plasma processing is $V_a$, the voltage $V_a$ is represented by, for example, the following equation (5).

$$V_a=V_0-V_{dc1} \quad (5)$$

An electrostatic force F' generated between the substrate W and the electrostatic electrode 1111*b* by the capacitive component 115 and the capacitive component 116 in the state of FIG. 3 is represented by, for example, the following equation (6).

$$F'=k(C_1(V_a+V_{dc1})/r)^2+k(C_2(V_a+V_{dc1})/r)^2 \quad (6)$$

Here, since the capacitance $C_2$ of the capacitive component 116 is negligibly smaller than the capacitance $C_1$ of the capacitive component 115, the electrostatic force F' generated between the substrate W and the electrostatic electrode 1111*b* may be approximated by, for example, as following equation (7).

$$F'\approx k(C_1(V_a+V_{dc1})/r)^2=k(C_1V_0/r)^2 \quad (7)$$

The capacitance $C_1$ of the capacitive component 115 is substantially the same as the capacitance $C_0$ of the capacitive component 115 during the adsorption processing. Therefore, referring to the above equations (1) and (7), an electrostatic force F', which is equivalent to the electrostatic force $F_0$ generated between the substrate W and the electrostatic electrode 1111*b* during the adsorption processing, is generated in the substrate W even during the plasma processing, regardless of the magnitude of the self-bias $V_{dc1}$.

As described above, in the present embodiment, the switch 51*a* of the relay circuit 51 is turned OFF during the plasma processing, and the electrostatic electrode 1111*b* is brought into the floating state, thereby preventing generation of excessive electrostatic force between the electrostatic electrode 1111*b* and the substrate W during the plasma processing. This prevents an increase in the frictional force between the substrate W and the substrate support surface 111*a*, and prevents particles generated by friction between the substrate W and the substrate support surface 111*a*.

Figure 4:
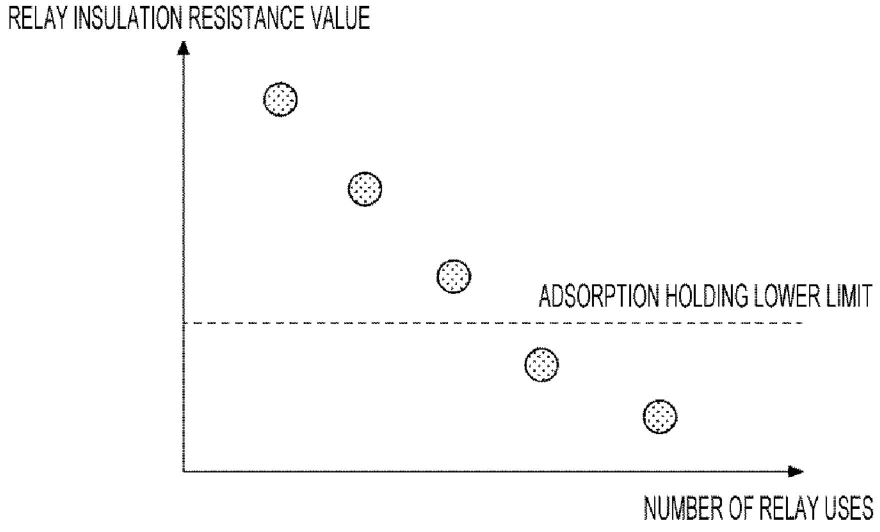
FIG. 4 is a diagram illustrating an example of a change over time in the number of times a relay circuit is used and an insulation resistance value according to an embodiment.

However, it could be seen that the adsorption force of the substrate W decreases while the electrostatic electrode 1111*b* is in the floating state. FIG. 4 is a diagram illustrating an example of a change over time in the number of times the relay circuit 51 is used and an insulation resistance value according to an embodiment. The relay circuit 51 has a relay box 51*b* formed of an insulator (see FIG. 3). The number of relay uses on the horizontal axis in FIG. 4 is the number of times the relay circuit 51 is turned ON and OFF, and the relay insulation resistance value on the vertical axis is the resistance value of the insulator forming the relay box 51*b*.

It can be seen from FIG. 4 that the insulation resistance value of the relay box 51*b* decreases as the number of times the relay circuit 51 is used increases. This means that as the number of times the relay circuit 51 is used increases, the relay box 51*b* deteriorates, the insulation of the relay box 51*b* weakens, and a charge flows directly from the relay box 51*b* to the ground side by the potential difference between the relay box 51*b* and a ground. Thus, the charges leak between the substrate W and the electrostatic electrode 1111*b*, resulting in a decrease in adsorption force that is generated between the substrate W and the electrostatic electrode 1111*b*.

When the adsorption force is less than the lower limit value for the adsorption holding of the substrate W, there is a risk that the substrate W will bounce and be damaged by the pressure on the back surface of the substrate W caused by He gas supplied to the back surface of the substrate W. Therefore, an adsorption force monitoring method has been proposed in the related art. For example, there is a method of measuring the leakage amount of He gas supplied to the back surface of the substrate W and determining that the adsorption force decreases when the leakage amount exceeds a threshold value. However, in this method, when the pressure between the back surface of the substrate W and the electrostatic chuck 1111 becomes greater than the adsorption force due to the supply of He gas, the leakage amount of He gas increases rapidly. As a result, it may not be possible to avoid the risk that the substrate W will bounce and be damaged. That is, it is important to detect a decrease in adsorption force generated between the substrate W and the electrostatic electrode 1111*b* before the leakage amount of He gas increases rapidly.

Therefore, in the present embodiment, by monitoring current flowing through the power supply line 52, the deterioration of the relay circuit 51 may be determined based on the charge leakage amount or the charge leakage rate. Thus, the adsorbed state of the substrate W is determined, and a decrease in adsorption force generated between the substrate W and the electrostatic electrode 1111*b* is detected. Based on this detected result, it is possible to take a necessary measure such as stopping the processing of the substrate W, for example, before the adsorption force decreases to the point where the substrate W bounces and is damaged.

[Method of Monitoring Change in Adsorption Force Over Time]

Figures 5A, 5B, 5C:
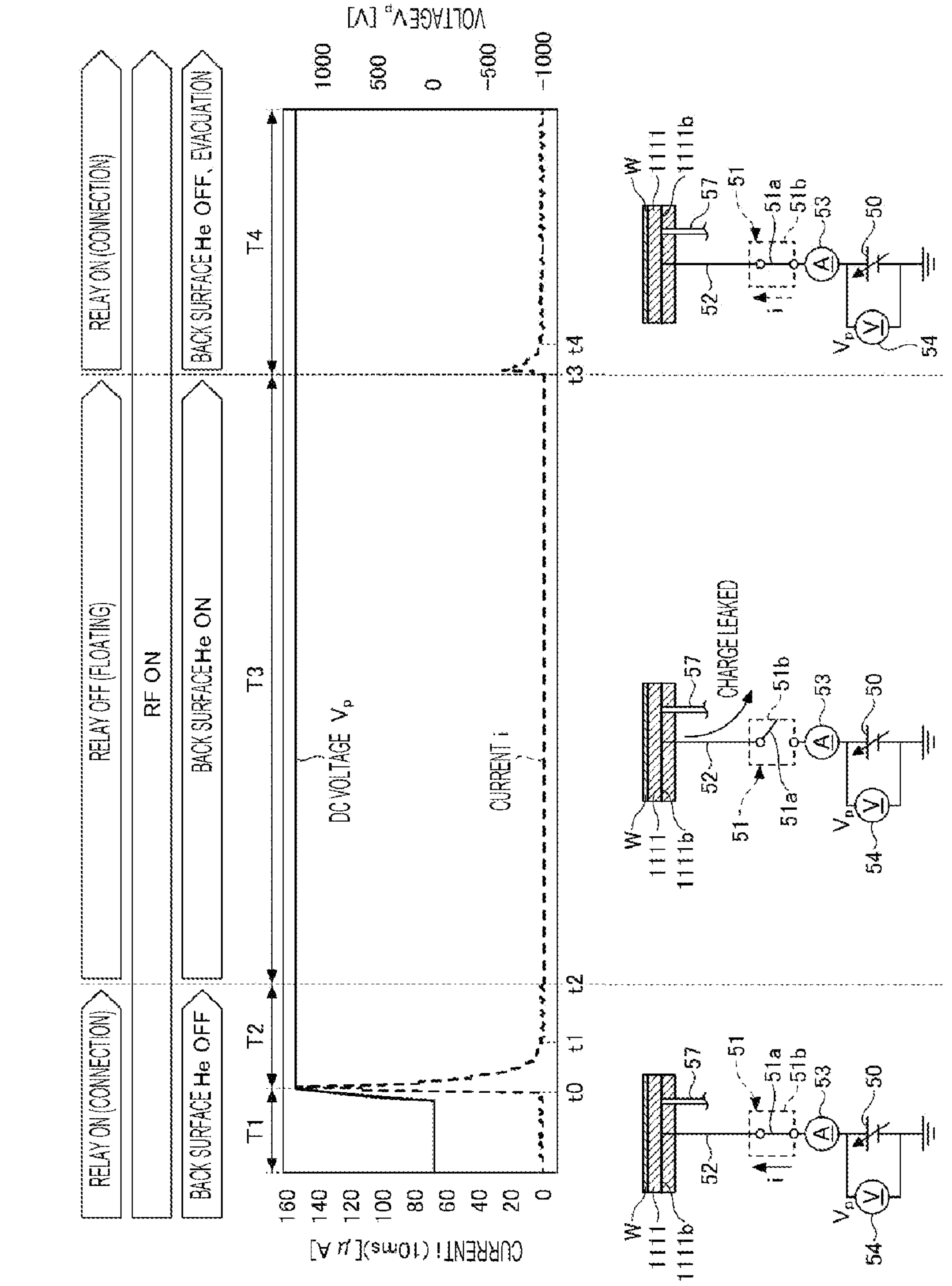
FIGS. 5A to 5C are diagrams illustrating a method of monitoring a decrease in adsorption force over time according to an embodiment.

Next, a method of monitoring a change in adsorption force over time in a sequence of adsorption processing, substrate processing, and static elimination processing according to the present embodiment will be described with reference to FIGS. 5A to 5C. FIGS. 5A to 5C are diagrams illustrating a method of monitoring the usage state of the relay circuit 51 and a decrease in adsorption force over time according to an embodiment.

The processings illustrated in FIGS. 5A to 5C are performed in order of (1) preparation processing (period T1) and adsorption processing (period T2), (2) substrate processing (period T3), and (3) static elimination processing (period T4). An example of the measured result of current i flowing through the power supply line 52 measured by an ammeter A and the measured result of a voltage $V_p$ output from the DC power supply 50 measured by a voltmeter $V_p$ at this time is illustrated. FIGS. 5A to 5C illustrate the ON and OFF states of the relay circuit 51 and the arrangement of the ammeter A that measures the current i and the voltmeter V that measures the voltage $V_p$ in (1) preparation processing and adsorption processing, (2) substrate processing, and (3) static elimination processing.

(1) Preparation Processing and Adsorption Processing

The period T1 is a preparation period for the adsorption processing, and an RF signal is supplied from the RF power supply 31 to the conductive member of the substrate supporting unit 11, the conductive member of the shower head 13, or both. Further, an inert gas such as argon gas is supplied into the plasma processing space 10*s* from the gas supplying unit 20. Thus, a plasma of the inert gas is generated in the plasma processing space 10*s*.

In the adsorption processing of the period T2, the DC power supply 50 is turned ON at the time $t_0$. At this time, the relay circuit 51 is in the ON state (see FIG. 5A), and the DC voltage $V_p$ is applied to the electrostatic electrode 1111*b*. He gas is not supplied to the back surface of the substrate W during the periods T1 and T2.

As the voltage changes from 0 to $V_p$ at this time, direct current i flows through the power supply line 52 connecting the DC power supply 50 and the electrostatic electrode 1111*b*. The ammeter A measures the current i and monitors a change in the current i. In the example of FIG. 5A, the current i measured by the ammeter A flows instantaneously from the time $t_0$ to the time $t_1$, and becomes 0 after the time $t_1$. At this time, an adsorption charge amount indicating the degree of adsorption force generated between the electrostatic electrode 1111*b* and the substrate W is calculated by integrating the current i flowing from the time $t_0$ to the time $t_1$. The adsorption charge amount is an amount of charges introduced to the electrostatic chuck 1111 between the time to and the time $t_1$.

(2) Substrate Processing

After the voltage supplied to the electrostatic electrode 1111*b* is stabilized in the period T2, a substrate processing is performed in the period T3. The period T3 is a period during which the substrate W is subjected to a plasma processing (also referred to as substrate processing), and subsequently, an RF signal is supplied from the RF power supply 31 to the conductive member of the substrate supporting unit 11, the conductive member of the shower head 13, or both. Further, a processing gas is supplied from the gas supplying unit 20 into the plasma processing space 10*s*. Thus, a plasma of the processing gas is generated in the plasma processing space 10*s*.

In the substrate processing of the period T3, the relay circuit 51 is switched from the ON state to the OFF state at the time $t_2$ while maintaining the ON state of the DC power supply 50 (see FIG. 5B), and the relay circuit 51 is brought into the floating state. Further, the supply of He gas to the back surface of the substrate W starts at the time $t_2$. The supply of He gas is continued during the period T3. The current i measured by the ammeter A is 0 in the period T3.

(3) Static Elimination Processing

The period T4 is a period during which a static elimination processing is performed. In the period T4, subsequently, an RF signal is supplied from the RF power supply 31 to the conductive member of the substrate supporting unit 11, the conductive member of the shower head 13, or both. Further, an inert gas such as argon gas is supplied into the plasma processing space 10*s* from the gas supplying unit 20. Thus, a plasma of the inert gas is generated in the plasma processing space 10*s*.

The relay circuit 51 is switched from the OFF state to the ON state at the time t3 while maintaining the ON state of the DC power supply 50 (see FIG. 5C). In this way, during the period T4, the switch 51*a* of the relay circuit 51 is connected to supply the voltage $V_p$ again from the DC power supply 50 to the electrostatic electrode 1111*b*. Further, at the time t3, the supply of He gas to the back surface of the substrate W stops, and after He gas on the back surface of the substrate W is evacuated so that the pressure of He gas becomes 0, the substrate W is detached from the electrostatic chuck 1111, and is unloaded from the plasma processing chamber 10.

When the relay circuit 51 is switched from the OFF state to the ON state at the time t3, the current i flows through the power supply line 52. In the example of FIG. 5, the current i measured by the ammeter A flows instantaneously from the time t3 to the time t4, and becomes 0 after the time t4. Here, the flowing current i is charges leaked from the relay box 51*b* to the ground side due to the deterioration of the relay box 51*b* while the relay circuit 51 is in the floating state during the period T3 (leakage charge amount). In other words, hear, the flowing current i is a current flowing through the power supply line 52 to replenish the charges lost by the electrostatic electrode 1111*b*.

Accordingly, the amount of charges leaked in the period T3 is calculated by integrating the current i flowing from the time t3 to the time t4. The leakage charge amount is an amount of charges replenished to the electrostatic chuck 1111 between the time t3 and the time t4.

In a method of monitoring a change in adsorption force over time, an adsorption charge amount, which is an amount of charges introduced during adsorption, may be used as a reference charge amount, a ratio of the leakage charge amount, which is an amount of charges replenished during static elimination, to the reference charge amount may be calculated, so that the charge leakage amount may be calculated with respect to the reference charge amount. Thus, it is possible to determine the adsorbed state of the substrate W by monitoring a decrease in adsorption force over time. Further, it is possible to reduce the difference between the substrates W and the mechanical difference of the plasma processing apparatuses 1 during this monitoring. Hereinafter, the ratio of the the leakage charge amount to the adsorption charge amount (reference charge amount) is also referred to as a “charge leakage rate.”

The integrated value of the current i is correlated with the maximum value of the current i. Thus, as another method of monitoring a change in adsorption force over time, the charge leakage amount may be calculated by calculating a ratio of the maximum value of the current i measured during static elimination to the maximum value of the current i measured during adsorption. Therefore, it is also possible to determine the adsorbed state of the substrate W by monitoring a decrease in adsorption force over time, and also to reduce the difference between the substrates W and the mechanical difference of the plasma processing apparatuses 1 during this monitoring. Hereinafter, the ratio of the maximum value of the current i measured during static elimination to the maximum value of the current i measured during adsorption is also referred to as a “current leakage rate.”

As yet another method of monitoring a change in adsorption force over time, the integrated value of the current i measured during static elimination or the maximum value of the current i measured during static elimination may be used as a “leakage charge amount.” Therefore, it is also possible to determine the adsorbed state of the substrate W by monitoring a decrease in adsorption force over time.

Figures 6A, 6B, 6C:
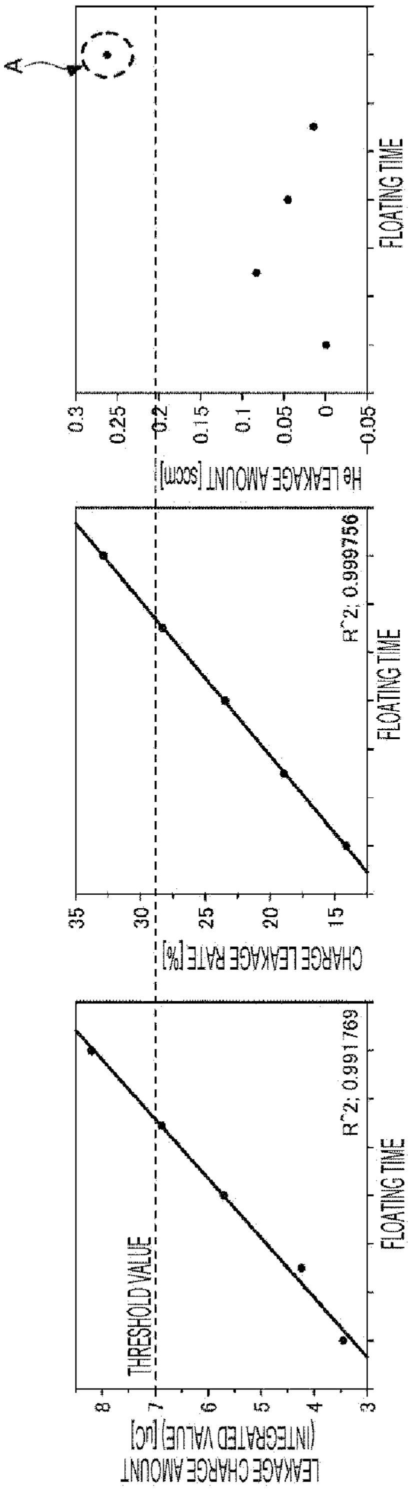
FIGS. 6A to 6C are diagrams illustrating an example of a floating time, a leakage charge amount, a charge leakage rate, and a leakage amount of He gas with regard to a relay circuit according to an embodiment.

FIG. 6A illustrates the leakage charge amount on the vertical axis with respect to the floating time of the relay circuit 51 on the horizontal axis, the leakage charge amount being an integrated value of the current i measured during static elimination. FIG. 6B illustrates the charge leakage rate on the vertical axis with respect to the floating time of the relay circuit 51 on the horizontal axis. The floating time is a time during which the switch 51*a* of the relay circuit 51 is turned OFF, and in the case of processing a plurality of substrates, is the total time during which the switch 51*a* is turned OFF when the plurality of substrates are successively processed. In both FIGS. 6A and 6B, the leakage charge amount and the charge leakage rate increase in proportion to the floating time of the relay circuit 51, and a decrease in adsorption force over time with regard to the electrostatic chuck 1111 may be monitored. As for the accuracy of measurement, the charge leakage rate is slightly higher than the leakage charge amount.

Meanwhile, FIG. 6C illustrates the leakage amount of He gas on the vertical axis with respect to the floating time of the relay circuit 51 on the horizontal axis. As illustrated in A of FIG. 6C, the leakage amount of He gas is the flow rate of He gas leaking between the substrate W and the electrostatic chuck 1111, and is not proportional to the floating time, but is increased rapidly at any time. Thus, it is not possible to detect a decrease in the adsorption force of the substrate at an appropriate timing before the substrate W bounces by the method of monitoring the leakage amount of He gas, and there is a risk that the substrate W bounces and is damaged at the time when the leakage amount of He gas is rapidly increased.

From the above, the threshold values of FIGS. 6A and 6B corresponding to the leakage charge amount and the charge leakage rate are set to values before He gas leaks and the substrate bounces, and are set in advance as the lower limit values for adsorption holding. Thus, it is possible to determine the adsorbed state of the substrate W from a relationship between the leakage charge amount or the like and the threshold value. Therefore, it is possible to detect a decrease in the adsorption force of the substrate W at an appropriate timing before the leakage amount of He gas increases and the substrate W bounces and is damaged. Thus, it is possible to check an appropriate replacement timing of the relay circuit 51. Further, it is possible to take an appropriate measure such as stopping the substrate processing when the leakage charge amount or the like exceeded the threshold value in order to avoid defective adsorption.

It is desirable to measure the current i every time (one by one) for each plasma processing of the substrate W. Thus, it is possible to prevent the substrate W from bouncing and being damaged. However, in an apparatus for processing substrates one by one, the current i may be measured for each substrate, the current i may be measured once for each lot, or may be measured at other timings. When calculating the charge leakage rate and the current leakage rate, it is essential to measure the current i at the times t0 to t1 and at the times t3 to t4 in FIGS. 5A to 5C. Meanwhile, when calculating the “leakage charge amount,” it is essential to measure the current i at the times t3 to t4 in FIGS. 5A to 5C, but not essential to measure the current i at the times t0 to t1. The controller 2 acquires the measured current i from the ammeter A.

Further, in FIGS. 5A to 5C, the timing of measuring the leakage charge amount was after the processing of the substrate W, but is not limited thereto, and may be during the processing of the substrate W.

[Monitoring Method]

Next, monitoring methods according to first to fourth embodiments will be described with reference to FIGS. 7 to 10. FIGS. 7 to 10 are flowcharts illustrating an example of the monitoring methods according to the first to fourth embodiments. The monitoring methods according to the first to fourth embodiments are executable by the controller 2.

First Embodiment

Figure 7:
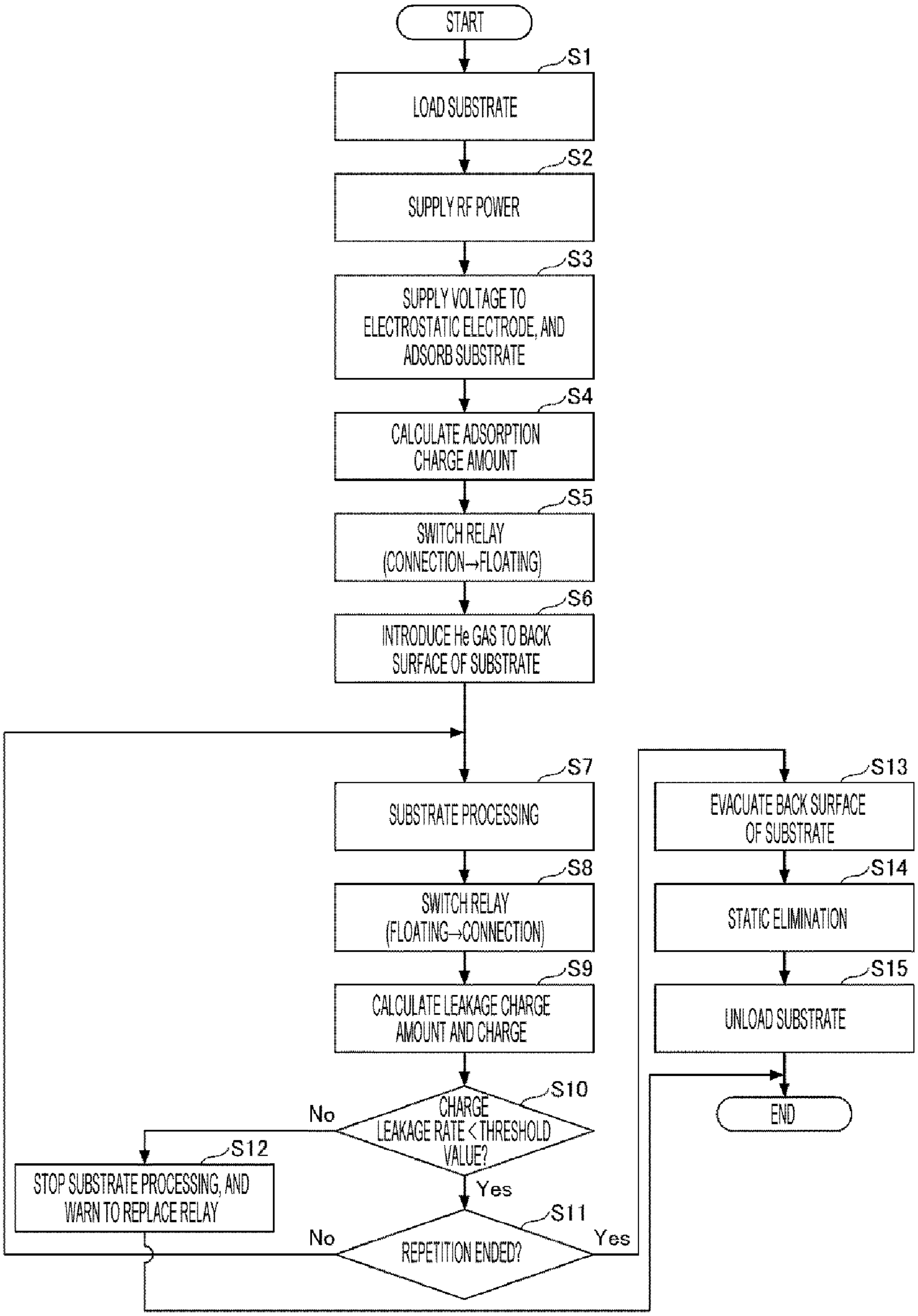
FIG. 7 is a flowchart illustrating an example of a monitoring method according to a first embodiment.

FIG. 7 is a flowchart illustrating an example of a monitoring method according to a first embodiment. The present embodiment will describe the case where the relay circuit 51 is switched during the processing of the substrate W, and the charge leakage rate is calculated from the current i measured during the processing of the substrate W and the current i measured during adsorption to determine the adsorbed state of the substrate.

When this processing starts, the controller 2 controls the loading of the substrate W into the plasma processing chamber 10 to dispose the substrate W on the electrostatic chuck 1111 (step S1). Next, the controller 2 supplies an RF signal (RF power) from the RF power supply 31 to the conductive member of the substrate supporting unit 11, the conductive member of the shower head 13, or both (step S2). Further, the controller 2 supplies an inert gas such as argon gas from the gas supplying unit 20 into the plasma processing space 10*s*. Thus, a plasma of the inert gas is generated in the plasma processing space 10*s*.

Next, the controller 2 turns on the DC power supply 50, supplies a voltage to the electrostatic electrode 1111*b*, and adsorbs the substrate W to the upper surface of the electrostatic chuck 1111 (step S3). By turning ON the DC power supply 50, the voltage changes from 0 to $V_p$, thereby causing the direct current i to flow through the power supply line 52 connecting the DC power supply 50 and the electrostatic electrode 1111*b*. The ammeter A measures the current i. The controller 2 acquires the current i measured by the ammeter A, and calculates the integrated value of the current I to use it as the adsorption charge amount (step S4).

After the voltage supplied to the electrostatic electrode 1111*b* is stabilized, the controller 2 switches the relay circuit 51 from the ON state to the OFF state to stop the supply of the voltage to the electrostatic electrode 1111*b* and bring the electrostatic electrode 1111*b* into the floating state (step S5). Next, the controller 2 introduces He gas to the back surface of the substrate W (step S6).

Next, the substrate W starts to be processed (step S7), and the processing of the substrate W illustrated in the processing of steps S7 to S11 is executed a preset number of times. The controller 2 switches the relay circuit 51 from the OFF state to the ON state during the processing of the substrate W (step S8), so that the relay circuit 51 is connected. Thus, the voltage is supplied from the DC power supply 50 to the electrostatic electrode 1111*b*. At this time, the ammeter A measures the current i flowing through the power supply line 52. The controller 2 acquires the current i measured by the ammeter A, calculates the integrated value of the current i as the the leakage charge amount, and calculates the ratio of the leakage charge amount to the adsorption charge amount, which is then used as the charge leakage rate (step S9).

Next, the controller 2 determines whether the charge leakage rate is smaller than the threshold value (step S10). In step S10, when it is determined that the charge leakage rate is equal to or greater than the threshold value, the controller 2 stops the processing of the substrate W, displays a warning to replace the relay circuit 51 (step S12), and ends this processing. When it is determined that the charge leakage rate is smaller than the threshold value, the controller 2 determines whether the processing of steps S7 to S11 was repeated a set number of times (step S11). When it is determined that the processing was not repeated the set number of times, the controller 2 returns to step S7 and continues the processing of the substrate W. In the processing of repeating steps S7 to S11, after the relay circuit 51 is switched once from the OFF state to the ON state in step S8, the relay circuit 51 is switched from the ON state to the OFF state before performing the processing of the next step S8.

In step S11, when it is determined that the processing of steps S7 to S11 was repeated the set number of times, the controller 2 stops the supply of He gas, and evacuates the back surface of the substrate W to reduce the pressure of He gas on the back surface of the substrate W to 0 (step S13). Then, the controller 2 performs a static elimination processing to detach the substrate W from the electrostatic chuck 1111 (step S14). Next, the controller 2 unloads the substrate W from the plasma processing chamber 10 (step S15), and ends this processing.

In the present embodiment, the charge leakage rate is calculated from the measured result of current, and the adsorbed state of the substrate W is determined based on the charge leakage rate. Thus, it is possible to monitor a decrease in adsorption force over time, to detect a decrease in the adsorption force of the substrate W at an appropriate timing, and to determine the adsorbed state of the substrate W. Further, it is possible to reduce the difference between the substrates W and the mechanical difference of the plasma processing apparatus 1 during this monitoring.

Second Embodiment

Figure 8:
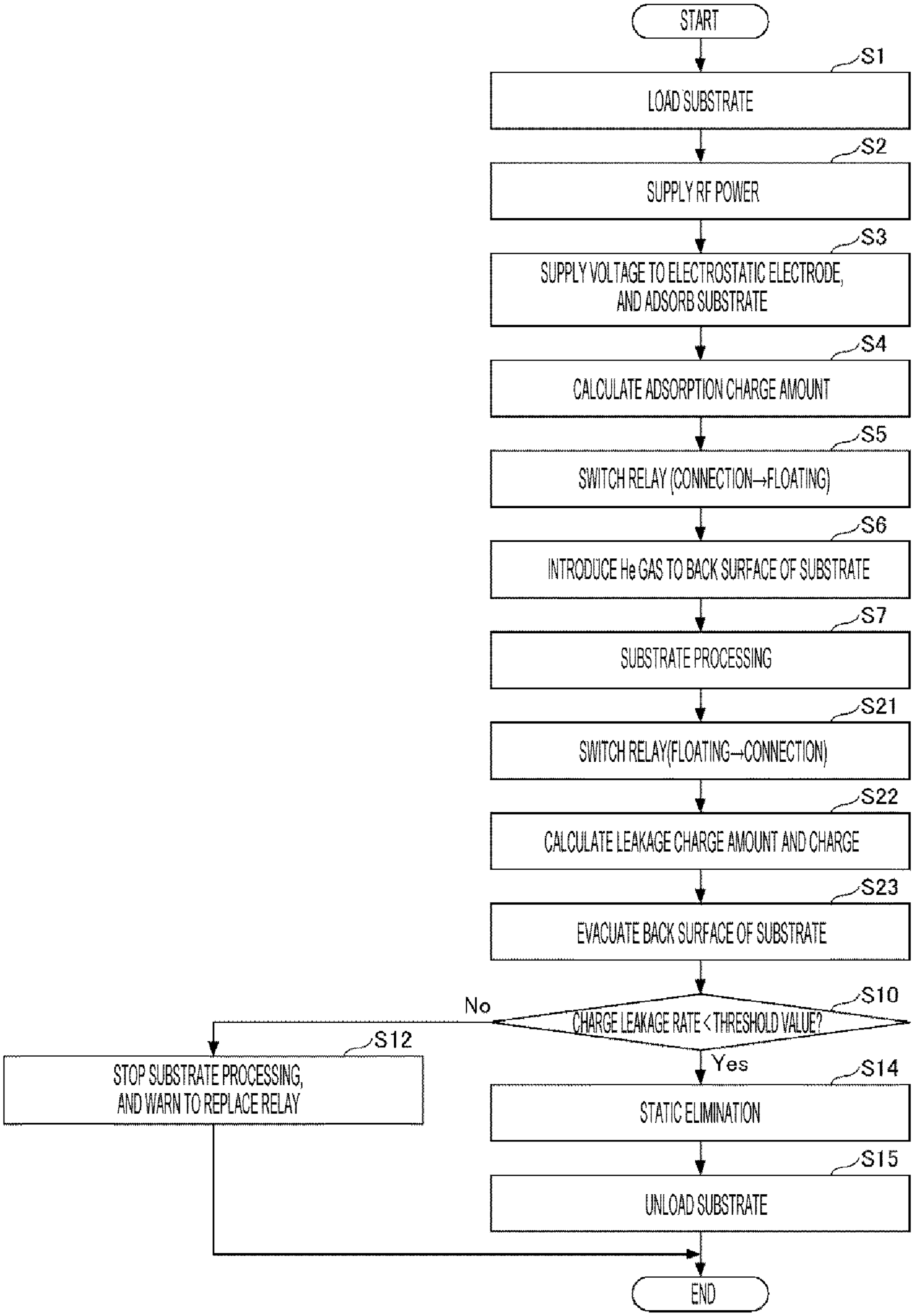
FIG. 8 is a flowchart illustrating an example of a monitoring method according to a second embodiment.

FIG. 8 is a flowchart illustrating an example of a monitoring method according to a second embodiment. The present embodiment will describe the case where the relay circuit 51 is switched after the processing of the substrate W, and the charge leakage rate is calculated from the measured current i to determine the adsorbed state of the substrate. The same step numbers will be given to the same processings as those of the monitoring method according to the first embodiment, and redundant descriptions will be omitted.

When this processing starts, the controller 2 executes the processing of steps S1 to S7. Thus, the substrate W is processed. After the processing of the substrate W, the controller 2 switches the relay circuit 51 from the OFF state to the ON state (step S21), so that the relay circuit 51 is connected. Thus, the voltage is supplied from the DC power supply 50 to the electrostatic electrode 1111*b*. The ammeter A measures the current i flowing through the power supply line 52. The controller 2 acquires the current i measured by the ammeter A, calculates the integrated value of the current i as the the leakage charge amount, and calculates the ratio of the leakage charge amount to the adsorption charge amount calculated in step S4, which is then used as the charge leakage rate (step S22).

Next, the controller 2 stops the supply of He gas, and evacuates the back surface of the substrate W (step S23). Next, the controller 2 determines whether the charge leakage rate is smaller than the threshold value (step S10). When it is determined that the charge leakage rate is equal to or greater than the threshold value, the controller 2 stops the processing of the substrate W, displays a warning to replace the relay circuit 51 (step S12), and ends this processing. In step S10, when it is determined that the charge leakage rate is smaller than a preset threshold value, the controller 2 performs a static elimination processing to detach the substrate W from the electrostatic chuck 1111 (step S14). Next, the controller 2 unloads the substrate W from the plasma processing chamber 10 (step 15), and ends this processing.

In the present embodiment, the charge leakage rate is calculated from the measured result of current, and the adsorbed state of the substrate W is determined based on the charge leakage rate. Thus, it is possible to monitor a decrease in adsorption force over time, to detect a decrease in the adsorption force of the substrate W at an appropriate timing, and to determine the adsorbed state of the substrate W. Further, it is possible to reduce the difference between the substrates W and the mechanical difference of the plasma processing apparatus 1 during this monitoring.

Third Embodiment

Figure 9:
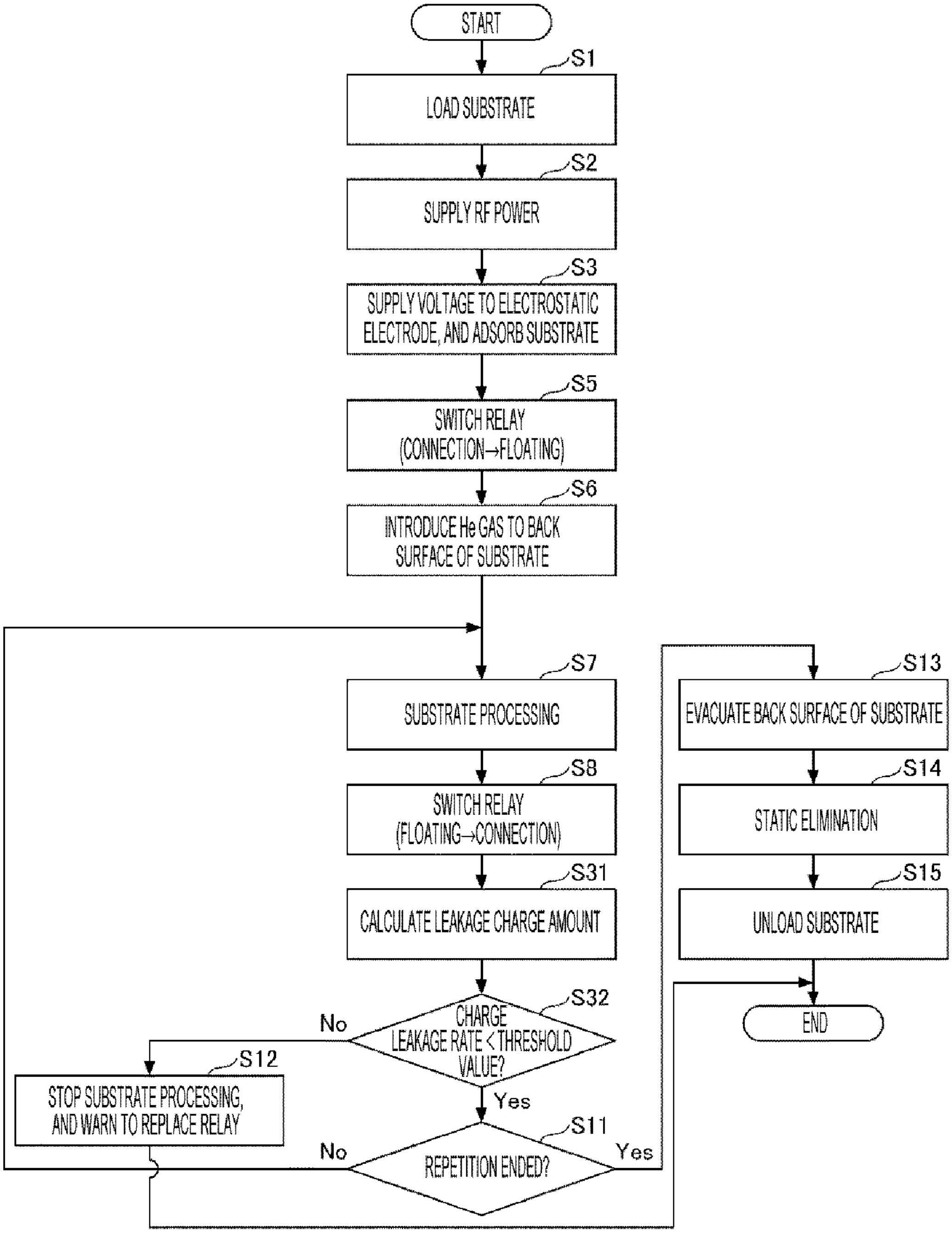
FIG. 9 is a flowchart illustrating an example of a monitoring method according to a third embodiment.

FIG. 9 is a flowchart illustrating an example of a monitoring method according to a third embodiment. The present embodiment will describe the case where the relay circuit 51 is switched during the processing of the substrate W, and the leakage charge amount is calculated from the measured current i to determine the adsorbed state of the substrate. The same step numbers will be given to the same processings as those of the monitoring methods according to the first and second embodiments, and redundant descriptions will be omitted.

When this processing starts, the controller 2 executes the processing of steps S1 to S3 and S5 to S8. In step S7, the substrate W starts to be processed, and the processing of the substrate W in steps S7, S8, S31, S32, and S11 is executed a preset number of times.

The processing of the substrate W starts (step S7), and during the processing of the substrate W, the relay circuit 51 is switched from the OFF state to the ON state (step S8). Thus, the voltage is supplied from the DC power supply 50 to the electrostatic electrode 1111*b*. At this time, the ammeter A measures the current i flowing through the power supply line 52, and the controller 2 acquires the current i measured by the ammeter A, and calculates the integrated value of the current i to use it as the the leakage charge amount (step S31). Next, the controller 2 determines whether the the leakage charge amount is smaller than the threshold value (step S32).

When it is determined that the leakage charge amount is equal to or greater than the threshold value, the controller 2 stops the processing of the substrate W, displays a warning to replace the relay circuit 51 (step S12), and ends this processing. In step S32, when it is determined that the leakage charge amount is smaller than the threshold value, the controller 2 determines whether the processing was repeated a set number of times (step S11). In step S32, when it is determined that the processing was not repeated the set number of times, the controller 2 returns to step S7 and continues the processing of the substrate W.

In step S11, when it is determined that the processing of steps S7 to S11 was repeated the set number of times, the controller 2 evacuates the back surface of the substrate W, performs a static elimination processing to unload the substrate W from the plasma processing chamber 10 (steps S13 to S15), and ends this processing.

In the present embodiment, the leakage charge amount is calculated from the measured result of current, and the adsorbed state of the substrate W is determined based on the leakage charge amount. Thus, it is possible to monitor a decrease in adsorption force over time, to detect a decrease in the adsorption force of the substrate W at an appropriate timing, and to determine the adsorbed state of the substrate W.

Fourth Embodiment

Figure 10:
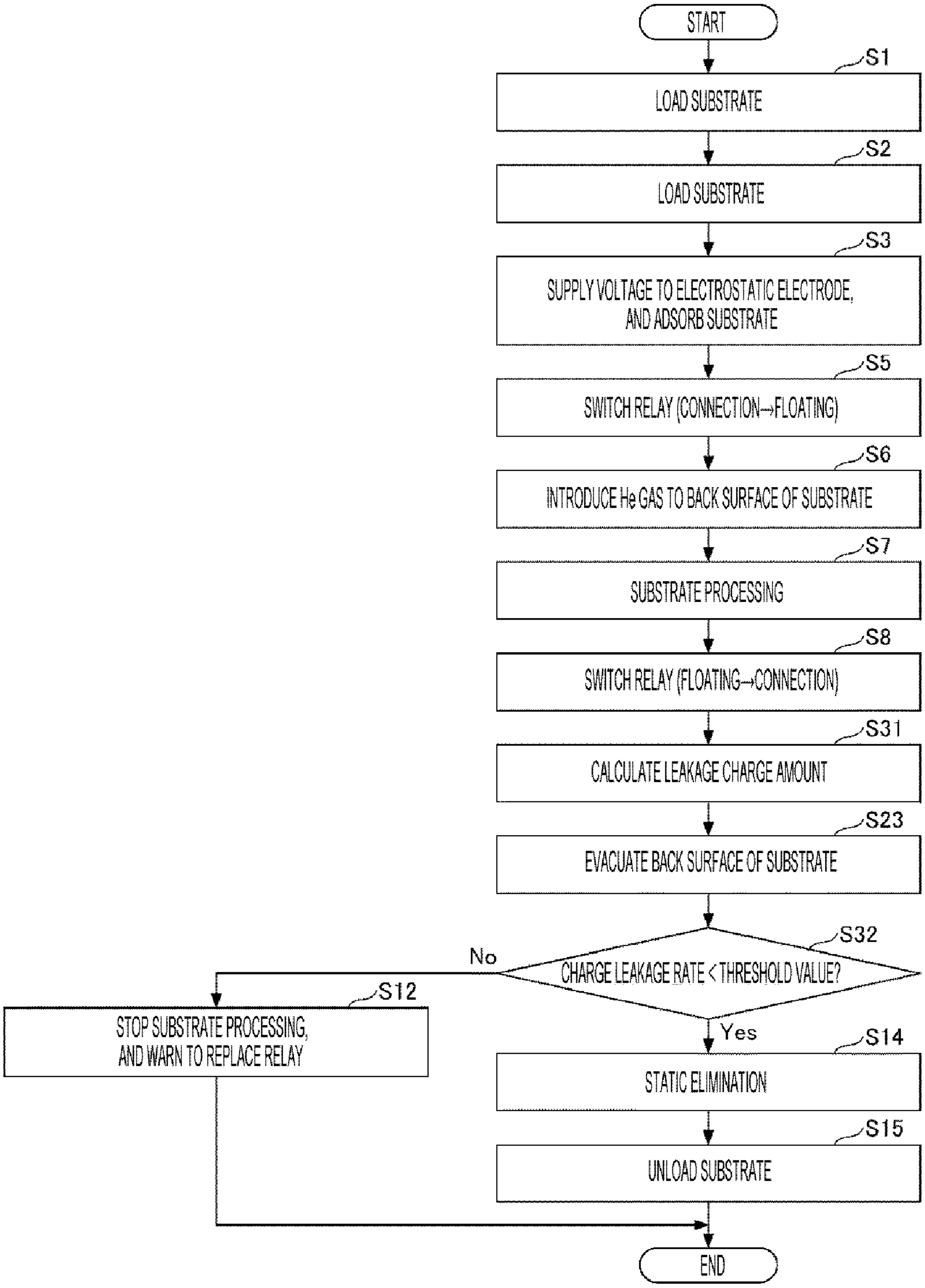
FIG. 10 is a flowchart illustrating an example of a monitoring method according to a fourth embodiment.

FIG. 10 is a flowchart illustrating an example of a monitoring method according to a fourth embodiment. The present embodiment will describe the case where the relay circuit 51 is switched after the processing of the substrate W, and the leakage charge amount is calculated from the measured current i to determine the adsorbed state of the substrate. The same step numbers will be given to the same processings as those of the monitoring methods according to the first to third embodiments, and redundant description will be omitted.

When this processing starts, the controller 2 executes the processing of steps S1 to S3 and S5 to S8. In step S7, the substrate W starts to be processed, and during the processing of the substrate W, the relay circuit 51 is switched from the OFF state to the ON state (step S8). Thus, the voltage is supplied from the DC power supply 50 to the electrostatic electrode 1111*b*. At this time, the ammeter A measures the current i flowing through the power supply line 52. The controller 2 acquires the current i measured by the ammeter A, and calculates the integrated value of the current I to use it as the leakage charge amount (step S31). The controller 2 stops the supply of He gas, and evacuates the back surface of the substrate W (step S23). Next, the controller 2 determines whether the leakage charge amount is smaller than the threshold value (step S32).

When it is determined that the leakage charge amount is equal to or greater than the threshold value, the controller 2 stops the processing of the substrate W, displays a warning to replace the relay circuit 51 (step S12), and ends this processing. In step S32, when it is determined that the the leakage charge amount is smaller than the threshold value, the controller 2 performs a static elimination processing to unload the substrate W from the plasma processing chamber 10 (steps S14 and S15), and ends this processing.

In the present embodiment, the leakage charge amount is calculated from the measured result of current, and the adsorbed state of the substrate W is determined based on the leakage charge amount. Thus, it is possible to monitor a decrease in adsorption force over time, to detect a decrease in the adsorption force of the substrate W at an appropriate timing, and to determine the adsorbed state of the substrate W.

As described above, according to the monitoring method and the plasma processing apparatus of the present embodiment, it is possible to detect a decrease in the adsorption force of the substrate W at an appropriate timing.

In the monitoring methods of the first to fourth embodiments, in step S12, the processing of the substrate W is stopped and a warning to replace the relay circuit 51 is displayed as an example of a warning, but the present disclosure is not limited to this. For example, only a warning to replace may be displayed. Further, the processing of the next substrate W may stop along with the display of the warning to replace, instead of stopping the processing of the current substrate W.

The processing of the substrate W performed by the plasma processing apparatus of the present disclosure includes, for example, an etching processing, a film formation processing, and the like. The plasma processing apparatus of the present disclosure may be applied to any of a single wafer apparatus for processing substrates one by one, and a batch apparatus as well as a semi-batch apparatus for collectively processing a plurality of substrates.

The monitoring method of each embodiment may be executed in such a manner that the controller 2 controls the plasma processing apparatus 1 based on a program for executing the monitoring method. The program for executing the monitoring method of each embodiment may be stored in the storage 2*a*2 such as ROM or RAM. The controller 2 may be implemented by the computer 2*a* that controls the operation of the monitoring method of each embodiment. At that time, the computer 2*a* reads out the program and executes the read program, thereby operating the plasma processing apparatus 1 according to each embodiment to execute the monitoring method, and detect a decrease in the adsorption force of the substrate W. The program may be acquired via a recording medium. The acquired program may be stored in the storage 2*a*2. The computer 2*a* may read the acquired program and execute the read program, thereby operating the plasma processing apparatus 1 to execute the monitoring method.

The monitoring method of each embodiment is not limited to being executed by the controller, and may be executed as an information processing device capable of communicating with the plasma processing apparatus 1 controls the plasma processing apparatus 1 in association with the controller 2 or without being associated with the controller 2. The information processing device operates the plasma processing apparatus 1 based on the program for executing the monitoring method to execute the monitoring method, thereby detecting a decrease in the adsorption force of the substrate W.

The information processing device may transmit and receive information through the communication interface 2*a*3 of the controller 2 via, for example, a network (not illustrated) and may operate the plasma processing apparatus 1 to execute the monitoring method. The information processing device may be implemented in any aspect as long as it is a computer connectable to the controller 2 or the plasma processing apparatus 1 via a network (not illustrated), and may be, for example, a cloud computer. Further, the program read by the information processing device may be stored in a storage area other than the storage 2*a*2, and may be, for example, a memory of the cloud computer.

According to an aspect, it is possible to detect a decrease in adsorption force of a substrate at an appropriate timing.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing apparatus comprising:

an electrostatic chuck accommodated in a plasma processing chamber, including an electrostatic electrode, and configured to adsorb a substrate by a voltage supplied to the electrostatic electrode;

a DC power supply configured to supply the voltage to the electrostatic electrode;

a relay circuit provided in a power supply line between the DC power supply and the electrostatic electrode, and configured to turn ON and OFF the supply of the voltage to the electrostatic electrode;

a plasma generator configured to generate a plasma inside the plasma processing chamber, wherein the plasma generator is an RF power supply; and a controller configured to control an overall operation of the plasma processing apparatus, wherein the controller is configured to:

(a) control the DC power supply to supply the voltage to the electrostatic electrode, thereby adsorbing the substrate to an upper surface of the electrostatic chuck;

(b) after the voltage supplied to the electrostatic electrode is stabilized, control the relay circuit to turn OFF the supply of the voltage to the electrostatic electrode, thereby bringing the electrostatic electrode into a floating state;

(c) after the voltage supplied to the electrostatic electrode is stabilized, control the plasma generator to start a plasma processing of the substrate adsorbed to the electrostatic chuck;

(d) after the plasma processing of the substrate is started, control the relay circuit to turn ON the supply of the voltage to the electrostatic electrode, thereby acquiring current flowing through the power supply line when the voltage is supplied to the electrostatic electrode; and (e) determine an adsorbed state of the substrate based on the current, wherein in (e):

the controller stops the plasma processing of the substrate based on a determined result of the adsorbed state of the substrate, or the controller displays a prompt signal for replacing the relay circuit based on the determined result of the adsorbed state of the substrate.

2. The plasma processing apparatus according to claim 1, wherein the controller is further configured to (f) acquire the current flowing through the power supply line when the voltage is supplied to the electrostatic electrode in (a), and wherein in (e), the controller determines the adsorbed state of the substrate based on the current in (f) and the current in (d).

3. The plasma processing apparatus according to claim 2, wherein in (e), the controller calculates a current leakage rate indicated by a ratio of an integrated value of the current acquired in (d) to an integrated value of the current acquired in (f), and determines the adsorbed state of the substrate based on the current leakage rate.

4. The plasma processing apparatus according to claim 2, wherein in (e), the controller calculates a charge leakage rate indicated by a ratio of a maximum value of the current acquired in (d) to a maximum value of the current acquired in (f), and determines the adsorbed state of the substrate based on the charge leakage rate.

5. The plasma processing apparatus according to claim 1, wherein in (e), the controller determines the adsorbed state of the substrate based on an integrated value of the current acquired in (d).

6. The plasma processing apparatus according to claim 1, wherein in (e), the controller determines the adsorbed state of the substrate based on a maximum value of the current acquired in the (d).

7. The plasma processing apparatus according to claim 1, wherein the controller performs (e) during the plasma processing of the substrate and/or after the plasma processing of the substrate.

8. A non-transitory computer-readable storage medium having stored therein a program to be executed by an information processing device that controls a plasma processing apparatus including:

an electrostatic chuck accommodated in a plasma processing chamber, including an electrostatic electrode, and configured to adsorb a substrate by a voltage supplied to the electrostatic electrode;

a DC power supply configured to supply the voltage to the electrostatic electrode;

a relay circuit provided in a power supply line between the DC power supply and the electrostatic electrode and configured to turn ON and OFF the supply of the voltage to the electrostatic electrode; and a plasma generator configured to generate a plasma inside the plasma processing chamber, wherein the plasma generator is an RF power supply, wherein the program causes the information processing device to execute a process including:

(a) controlling the DC power supply to supply the voltage to the electrostatic electrode, thereby adsorbing the substrate to an upper surface of the electrostatic chuck;

(b) after the voltage supplied to the electrostatic electrode is stabilized, controlling the relay circuit to turn OFF the supply of the voltage to the electrostatic electrode, thereby bringing the electrostatic electrode into a floating state;

(c) after the voltage supplied to the electrostatic electrode is stabilized, controlling the plasma generator to start a plasma processing of the substrate adsorbed to the electrostatic chuck;

(d) after the plasma processing of the substrate is started, controlling the relay circuit to turn ON the supply of the voltage to the electrostatic electrode, thereby acquiring current flowing through the power supply line when the voltage is supplied to the electrostatic electrode; and (e) determining an adsorbed state of the substrate based on the current, wherein in (e):

the plasma processing of the substrate is stopped based on a determined result of the adsorbed state of the substrate, or a prompt signal is displayed, the prompt signal being for replacing the relay circuit based on the determined result of the adsorbed state of the substrate.

* * * * *